US007968970B2

(12) United States Patent
Takahashi (10) Patent No.: US 7,968,970 B2
(45) Date of Patent: Jun. 28, 2011

(54) SEMICONDUCTOR DEVICE, METHOD FOR MANUFACTURING SEMICONDUCTOR DEVICE, AND POWER AMPLIFIER ELEMENT

(75) Inventor: Kazuaki Takahashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/435,744

(22) Filed: May 5, 2009

(65) Prior Publication Data

US 2009/0283861 A1    Nov. 19, 2009

(30) Foreign Application Priority Data

May 14, 2008   (JP) .................................. 2008-127057

(51) Int. Cl.
*H01L 21/70*   (2006.01)
(52) U.S. Cl. ................ 257/545; 257/554; 257/E29.019; 257/E29.174
(58) Field of Classification Search .................. 257/545, 257/554, E29.019, E29.174
See application file for complete search history.

(56) References Cited

U.S. PATENT DOCUMENTS

| 4,704,368 A | * | 11/1987 | Goth et al. | ..................... 438/329 |
| 2006/0076629 A1 | * | 4/2006 | Yilmaz | ......................... 257/378 |

FOREIGN PATENT DOCUMENTS

| JP | 59-232439 A | 12/1984 |
| JP | 05-109884 A | 4/1993 |
| JP | 11-214398 A | 8/1999 |

* cited by examiner

*Primary Examiner* — Tan N Tran
(74) *Attorney, Agent, or Firm* — Sughrue Mion, PLLC (57) ABSTRACT

A semiconductor device is presented, which includes a semiconductor substrate with a high concentration impurity of a first type conductivity and an epitaxial layer with a low concentration impurity provided on the semiconductor substrate, where a trench coupled to the semiconductor substrate is provided in the epitaxial layer with the low concentration impurity. And the semiconductor device further includes a high concentration impurity region of the first type conductivity having the same type conductivity as the type of the semiconductor substrate formed in at least the epitaxial layer with the low concentration impurity along an inner wall of the trench and coupled to the semiconductor substrate with the high concentration impurity of a first type conductivity, and contacts formed on the high concentration impurity region of the first type conductivity.

10 Claims, 9 Drawing Sheets

*Prior Art*

FIG. 6A

*Prior Art*

SEMICONDUCTOR DEVICE, METHOD FOR MANUFACTURING SEMICONDUCTOR DEVICE, AND POWER AMPLIFIER ELEMENT

This application is based on Japanese patent application NO. 2008-127,057, the content of which is incorporated hereinto by reference.

BACKGROUND

1. Technical Field

The present invention relates to a semiconductor device, a process for manufacturing a semiconductor device and a power amplifier element.

2. Related Art

When an element is assembled via a wire bonding process for power amplifier elements (discrete, integrated circuit (IC)), a gain of the power amplifier deteriorates due to an inductance of the wire. Such gain deterioration is considerably exhibited in an emitter terminal or in a ground (Gnd) terminal of IC. Such deterioration of the gain is caused because voltage between a base and an emitter (VBE) in an output a transistor is reduced due to an inductance of a wire coupled in series to the emitter. For example, a bonding wire having a length of 0.3 mm has an inductance of about 0.2 nH. When an alternating current of 100 mA amplitude is applied at 2.4 GHz through such bonding wire, a decrease of the gain of 4 dB is estimated due to a deterioration of VBE. A structure for utilizing a semiconductor substrate as a GND (earth) without utilizing a bonding wire for an emitter, in order to reduce the deterioration of the gain, is disclosed. The use of such structure allows an electric current path to a semiconductor substrate having lower inductance and lower resistance.

Figure 6A:
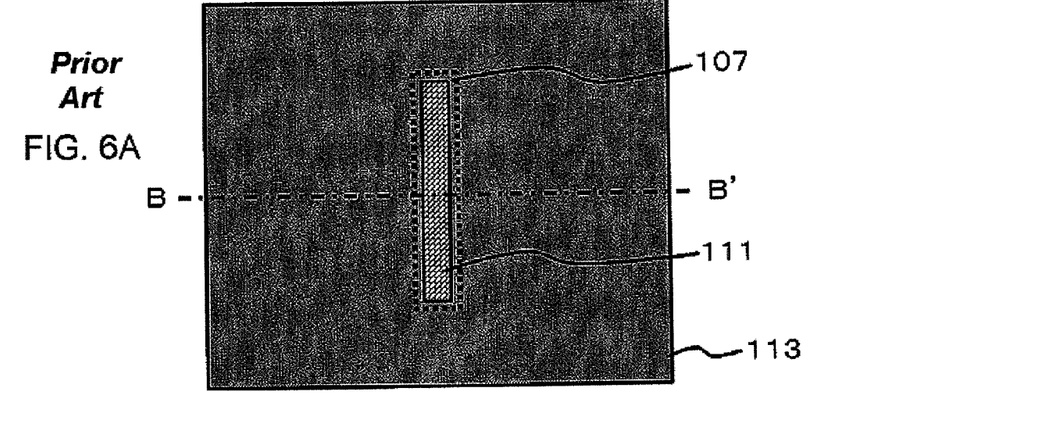
FIG. 6A is a plan view, illustrating a semiconductor device according to a related technology.
Figure 6B:
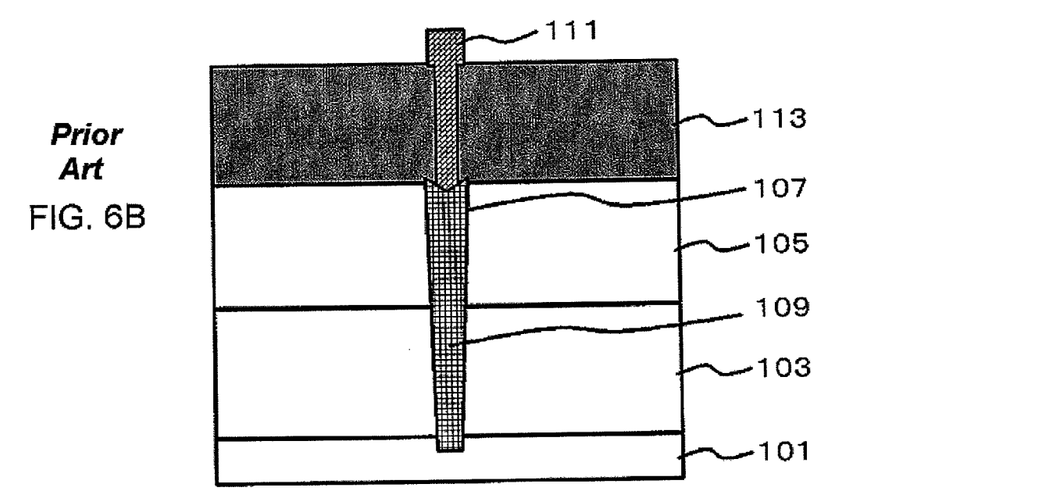
FIG. 6B is a cross-sectional view thereof.

A typical conventional technology will be described. A plan view of a semiconductor device according to a conventional technology is shown in FIG. 6A. FIG. 6B is a cross-sectional view along line B-B' of FIG. 6A. A constitution of a wafer (substrate) includes a P-type substrate 101 and a P-type epitaxial layer 103 formed thereon, and further an N-type epitaxial layer 105 formed thereon. A substrate contact 107 may be formed as follows. An etching process is conducted from a wafer surface to the P-type substrate 101, and then the etched feature is filled with a high-concentration doped polysilicon 109. Further, a terminal is provided on the high-concentration doped polysilicon 109 in the substrate contact 107. Japanese Patent Laid-Open No. H11-214,398 (1999) describes a structure similar to the above-described structure, though a manner for creating a contact 111 is not clearly presented. An electrically conducting path routes from the contact 111 in the side of the upper surface of the wafer through the high-concentration doped polysilicon 109 to be coupled to the P-type substrate 101.

Figure 7A:
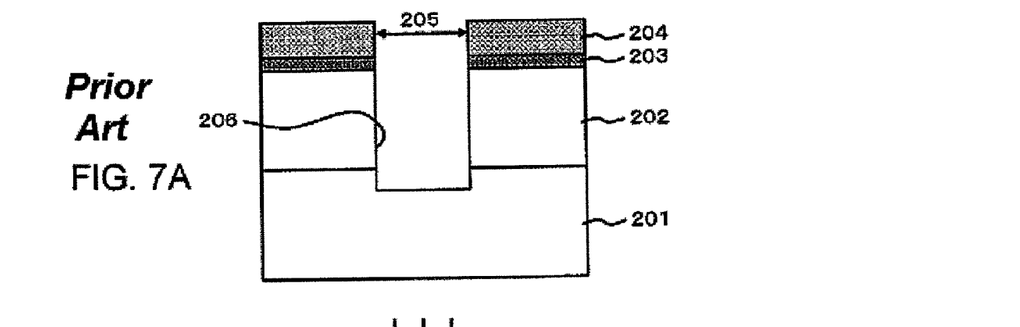
FIGS. 7A to 7D are cross-sectional views, illustrating a process for manufacturing the semiconductor device according to a related technology.
Figure 7B:
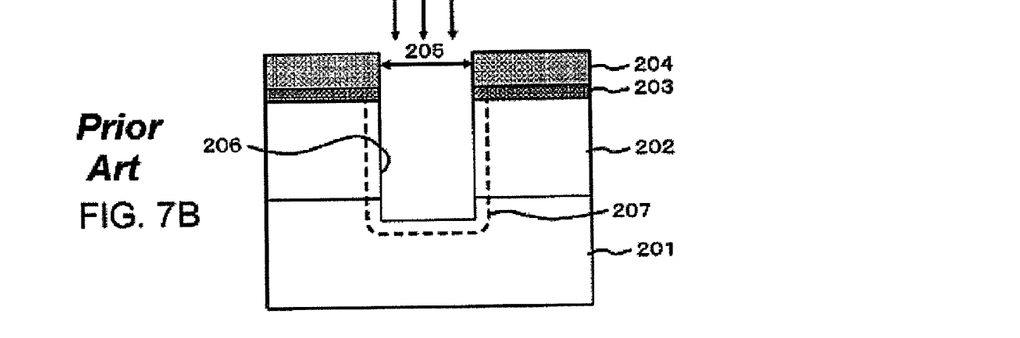
Figure 7C:
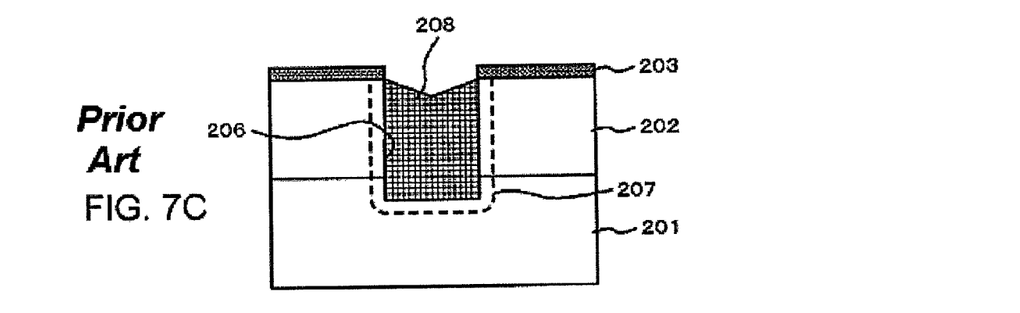
Figure 7D:
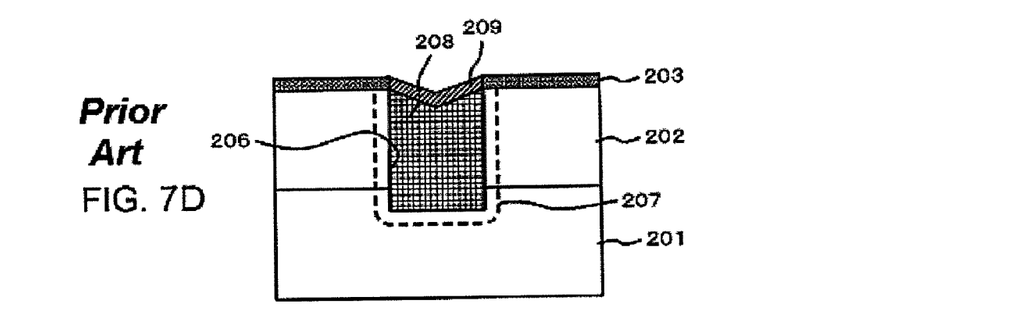

Further, Japanese Patent Laid-Open No. S59-232,439 (1984) described a structure of a semiconductor device as shown in FIG. 7D. FIGS. 7A to 7D show a manufacturing process for such semiconductor device. In the formation of a metal oxide semiconductor (MOS) IC, an N-type silicon epitaxial layer 202 and an oxide film 203 are consecutively formed on a P-type silicon substrate 201. Further, a resist film 204 having an opening width 205 corresponding to the element isolating region width is formed on the oxide film 203. A U-trench 206 extending through the oxide film 203 to the P-type silicon substrate 201 is formed via an etching process (FIG. 7A). Then, an ion implantation of boron (B) is conducted to selectively form a high-concentration Boron-implanted region 207 in an inner surface, particularly in the bottom surface of the U-shaped trench 206 (FIG. 7B). After the resist film 204 is removed, an undoped silicon is selectively grown on an inner surface of the U-shaped trench 206 having a silicon section exposed thereon, which has been created in the U-shaped trench 206 via an ordinary selective epitaxial growth technique conducted at a temperature of around 1,000 degrees C. Simultaneously, an auto-doping of Boron is caused in the silicon epitaxial layer from a high-concentration Boron-implanted region 207 to form P+ type silicon epitaxial layer 208 in the U-shaped trench 206 (FIG. 7C). Lastly, an oxide film 209 is formed on the surface of the P+ type silicon epitaxial layer 208 (FIG. 7D). It is disclosed that the element isolation region of the semiconductor device is formed by the above-mentioned process.

Figure 8A:
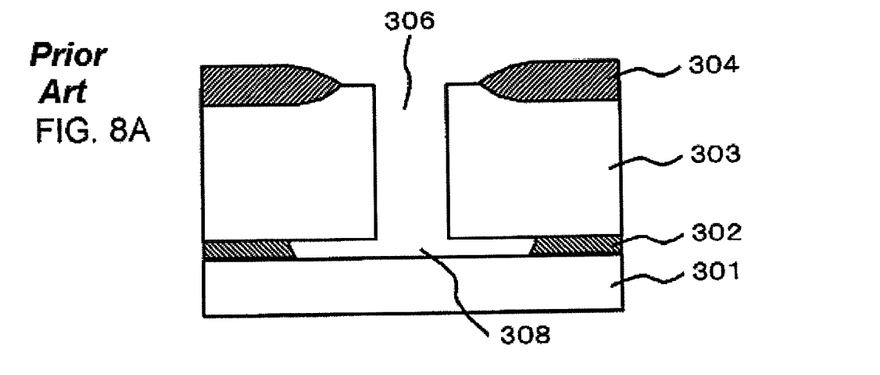
FIGS. 8A to 8C are cross-sectional views, illustrating a process for manufacturing the semiconductor device according to a related technology.
Figure 8B:
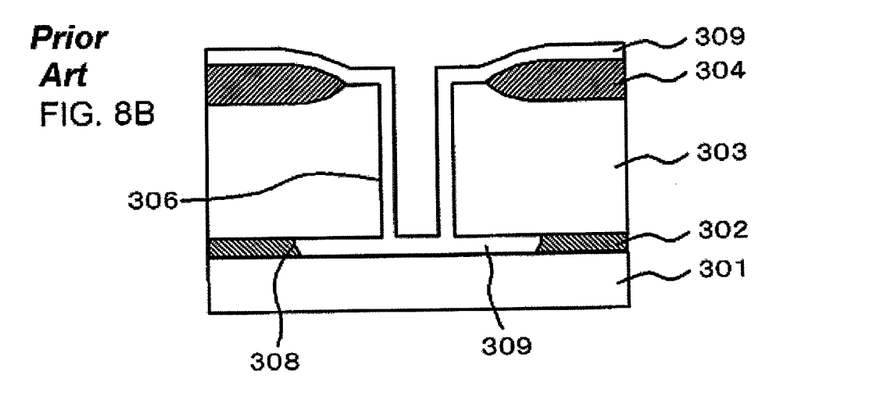
Figure 8C:
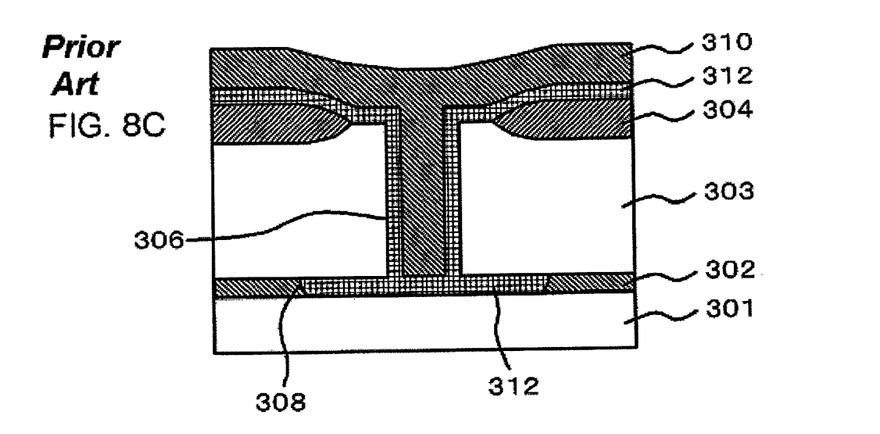
Figure 9A:
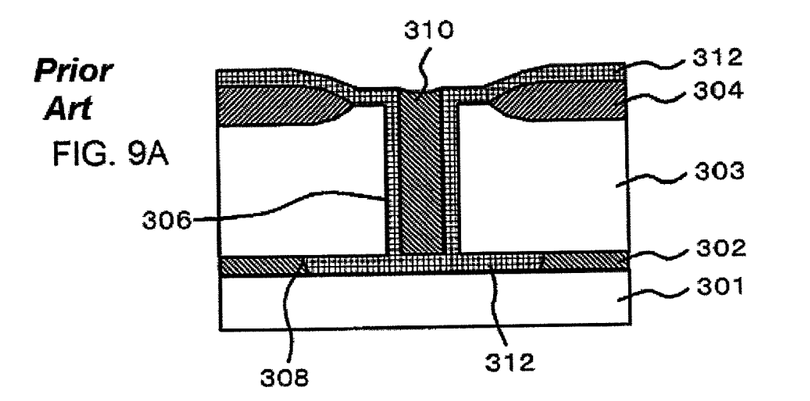
FIGS. 9A to 9C are cross-sectional views, illustrating a process for manufacturing the semiconductor device according to a related technology.
Figure 9B:
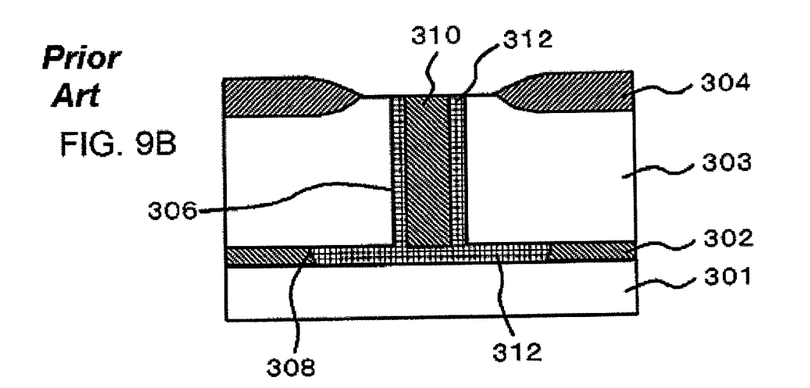
Figure 9C:
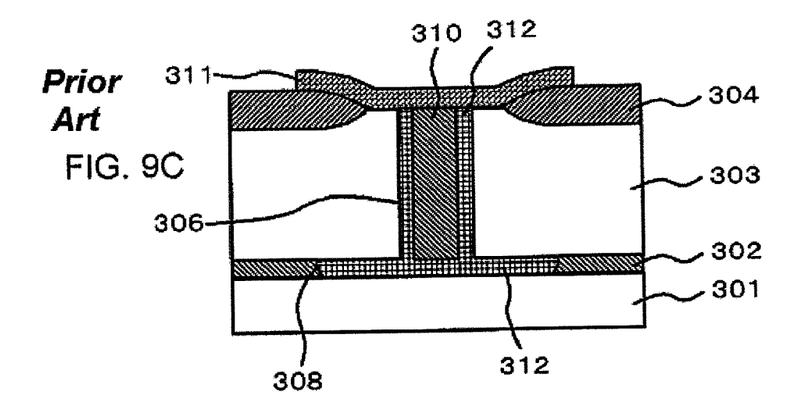

Further, Japanese Patent Laid-Open No. H5-109,884 (1993) describes a configuration of a semiconductor device, which is manufactured by the following manufacturing process illustrated in FIGS. 8A to 8C and FIGS. 9A to 9C. A semiconductor layer 303 for a silicon on insulator (SOI) substrate (referred to as the semiconductor layer 303 for a SOI substrate for a combination of an N+ type silicon layer and an N-type epitaxial silicon layer) is disposed on the N+ type silicon support substrate 301 through an oxide film 302 for SOI. A U-shaped trench 306 for contacting with the substrate, which extends through the semiconductor layer 303 for the SOI substrate and exposes the oxide film 302 for SOI, is formed, and further, the oxide film 302 for SOI is selectively removed (FIG. 8A). An undoped polysilicon layer 309 is deposited on the surface of U-shaped trench 306 for contacting with the substrate including a side of an eliminated section 308 of the oxide film 302 for SOI and on the surface of the semiconductor layer 303 for the SOI substrate (FIG. 8B). A spin-on-glass (SOG) layer 310 containing an electroconductive impurity is applied on the undoped polysilicon layer 309. Subsequently, a solid phase diffusion of an impurity is caused from the spin-on-glass layer 310 via a thermal process to provide an electroconductivity to the undoped polysilicon layer 309 (formation of N+ type polysilicon layer 312 provided with an electroconductivity) (FIG. 8C). The spin-on-glass layer 310 on the semiconductor layer 303 for the SOI substrate is selectively removed via an etch back process, and the rest of the spin-on-glass layer 310 remaining on the top surface of the U-shaped trench 306 for contacting with the substrate is planarized (FIG. 9A). In the above process, a power source electrode (not shown) is derived by the N+ type polysilicon layer 312 provided with the electroconductivity through U-shaped trench 306 for contacting with the substrate from the top of the N+ type silicon support substrate 301 to the top of the semiconductor layer 303 for the SOI substrate. It is also described in the document that a contact resistance of such power source electrode on the N+ type silicon support substrate 301 is reduced. Further, a portion of the N+ type polysilicon layer 312 exposed on the upper surface of the substrate is removed (FIG. 9B). An undoped polysilicon is deposited, and an N-type impurity is ion-implanted at a higher concentration on a region serving as a substrate-contacting electrode to form an N+ type substrate contact electrode 311 coupled to the N+ type silicon support substrate 301 through the N+ type polysilicon layer 312.

However, the above-described conventional technologies have to be improved in terms of the following points. In the configuration to shown in FIG. 6, the high-concentration doped polysilicon 109 is employed as an electric conducting path. However, the resistivity is still higher even if polysilicon is doped at higher concentration, and a decrease in the resistance is strictly limited. Therefore, there is still a room of improvement to obtain an electric conducting path with lower resistance.

Besides, Japanese Patent Laid-Open No. S59-232,439 (1984) is directed to a method for forming an element isolation region, and no electric conducting path with lower resistance is obtained. In Japanese Patent Laid-Open No. S59-232, 439, a P-type silicon substrate 201, or in other words a low concentration silicon substrate, is employed for a substrate. However, a use of a high concentration substrate is essential for the substrate contact coupled from an upper surface to a back surface of a wafer with lower resistance, a use of a low concentration silicon substrate cannot achieve creating a substrate contact in terms of the characteristics. Further, no contact is formed in the technology disclosed in Japanese Patent Laid-Open No. S 59-232,439.

Further, in Japanese Patent Laid-Open No. H5-109,884 (1993), an electroconductive impurity is diffused to an undoped polysilicon layer from a spin-on-glass layer containing the impurity via a thermal processing. However, a sufficient level of the impurity diffusion from the high concentration spin-on-glass layer is not easy. This is because, in particular, a diffusion coefficient of boron (B) is smaller and the like. Besides, a problem of a difficulty in filling a U-shaped trench with a spin-on-glass without a vacancy is caused. Therefore, an electric conducting path with lower resistance may not be obtained.

The present invention is made based on the above-described circumstances, and the present invention is to provide a semiconductor device having an electric current path from a side of a top surface of a wafer to a substrate with a lower resistance, and also to provide a process for manufacturing thereof.

SUMMARY

According one aspect of the present invention, there is provided a semiconductor device, comprising: a semiconductor substrate with a high concentration impurity of a first type conductivity; an epitaxial layer with a low concentration impurity provided on the semiconductor substrate with the high concentration impurity of a first type conductivity; a trench coupled to the semiconductor substrate with the high concentration impurity of a first type conductivity being provided in the epitaxial layer with the low concentration impurity; a high concentration impurity region of the first type conductivity, formed in at least the epitaxial layer with the low concentration impurity along an inner wall of the trench and coupled to the semiconductor substrate with the high concentration impurity of a first type conductivity; and a contact formed on the high concentration impurity region of the first type conductivity.

According to the above-described aspect of the present invention, the high concentration impurity region is formed in the epitaxial layer along the trench. Such high concentration impurity region can be utilized as an electric conducting path with lower resistance, so that an electric conducting path with reduced resistance and reduced inductance, extending from the upper surface of the contact through the high concentration impurity region to the substrate, is achieved.

According another aspect of the present invention, there is provided a power amplifier element, which includes, as an emitter terminal: a semiconductor substrate with a high concentration impurity of a first type conductivity; an epitaxial layer with a low concentration impurity provided on the semiconductor substrate with the high concentration impurity of a first type conductivity; a trench coupled to the semiconductor substrate with the high concentration impurity of a first type conductivity being provided in the epitaxial layer with the low concentration impurity; a high concentration impurity region of the first type conductivity, formed in at least the epitaxial layer with the low concentration impurity along an inner wall of the trench and coupled to the semiconductor substrate with the high concentration impurity of a first type conductivity; and a contact formed on the high concentration impurity region of the first type conductivity.

According to the above-described aspect of the present invention, the high concentration impurity region is formed in the epitaxial layer along the trench, and such high concentration impurity region can be utilized as an electric conducting path with lower resistance, and an electric conducting path with reduced resistance and reduced inductance, extending from the upper surface of the contact through the high concentration impurity region to the substrate, is coupled to the emitter of the power amplifier element, such that a gain drop of a bonding wire ordinarily employed for the emitter terminal due to the inductance is avoided, thereby obtaining high gain characteristics.

According further aspect of the present invention, there is provided a method for manufacturing a semiconductor device, comprising: forming an epitaxial layer with a low concentration impurity on a high concentration semiconductor substrate of the first type conductivity; forming a trench by conducting a selective etching, the trench extending through the epitaxial layer with the low concentration impurity and being coupled with the semiconductor substrate with the high concentration impurity of the first type conductivity; forming a high concentration impurity region of the first type conductivity by introducing an impurity from the surface of the trench via a thermal processing, the high concentration impurity region of the first type conductivity being formed in the epitaxial layer with the low concentration impurity along an inner wall of the trench and being formed to be coupled with the semiconductor substrate with the high concentration impurity of the first type conductivity; and forming a contact by forming an insulating film on the epitaxial layer with the low concentration impurity, the contact extending through the insulating film and being disposed on the high concentration impurity region of the first type conductivity.

According to the method according to the present invention, the trench is once formed and then an impurity is introduced at higher concentration from the surface thereof via a thermal processing, so that an electric conducting path of reduced resistance composed of the high concentration impurity region and coupled to the high concentration semiconductor substrate is formed. In the semiconductor device manufactured by such method, an electric conducting path with reduced resistance extending from the upper surface of the contact through the high concentration impurity region to the substrate is achieved.

According to the present invention, an electric conducting path with reduced resistance and reduced inductance extending from the upper surface of the contact to the substrate is provided.

When such semiconductor device is employed for a power amplifier element, high gain characteristics are realized.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in detail as follows in reference to the annexed figures. In all figures, an identical numeral is assigned to an element commonly appeared in the figures, and the detailed description thereof will not be repeated.

First Embodiment

Figure 1A:
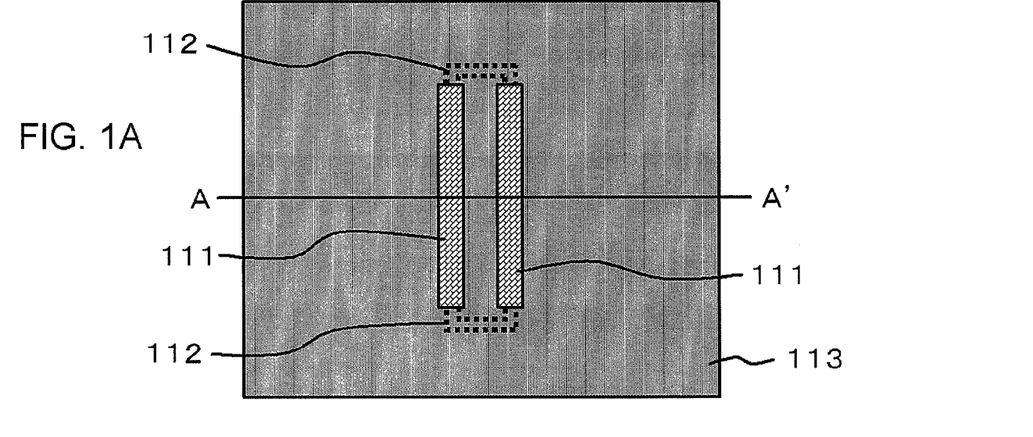
FIG. 1A is a plan view, illustrating a semiconductor device according to first embodiment.
Figure 1B:
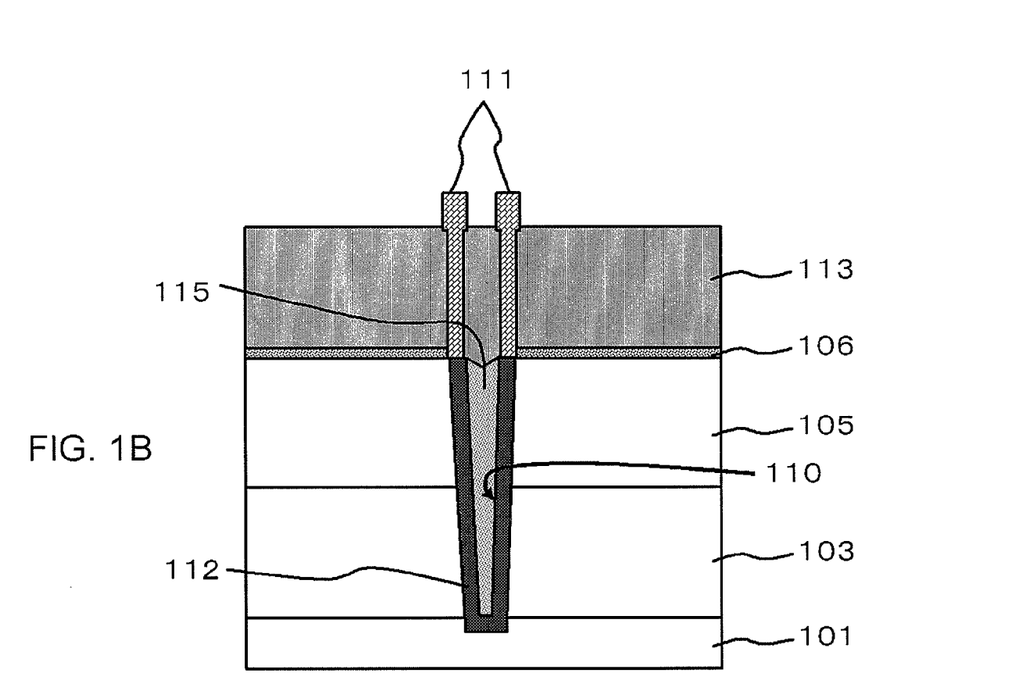
FIG. 1B is a cross-sectional view thereof.

A semiconductor device in first embodiment is illustrated in FIGS. 1A and 1B. A semiconductor device according to first embodiment includes a high concentration semiconductor substrate 101 of a first type conductivity and an epitaxial layers 103 and 105 with a low concentration impurity provided on the high concentration semiconductor substrate 101 of the first type conductivity, where a trench 110 coupled to the high concentration semiconductor substrate 101 of the first type conductivity being provided in the epitaxial layers 103 and 105 with a low concentration impurity, and where the semiconductor device further comprises a high concentration impurity region 112 of the first type conductivity, formed in at least the epitaxial layers 103 and 105 with a low concentration impurity along an inner wall of the trench 110 and coupled to the high concentration semiconductor substrate 101 of the first type conductivity, and contacts 111 formed on the high concentration impurity region 112 of the first type conductivity. FIG. 1A is a plan view of the semiconductor device of the present embodiment, and FIG. 1B is cross-sectional view along line A-A' of FIG. 1A. The configuration of the semiconductor device to show in FIG. 1 includes a P-type substrate 101 with an impurity at higher concentration, a P-type epitaxial layer 103 with an impurity at lower concentration provided on the P-type substrate 101, and an N-type epitaxial layer 105 with an impurity at lower concentration further formed thereon.

Figure 2:
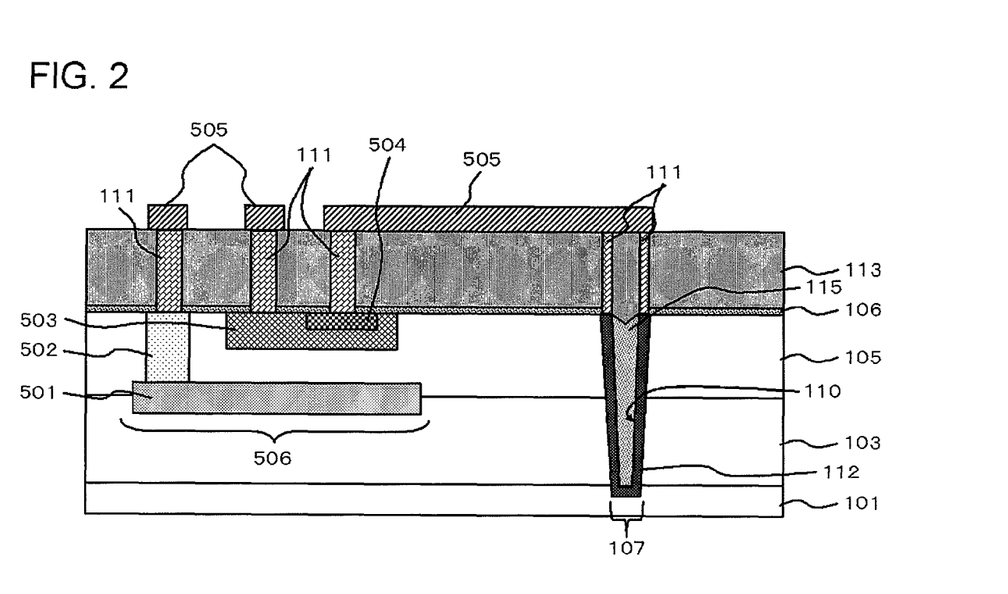
FIG. 2 is a cross-sectional view of the semiconductor device according to first embodiment.

The P-type substrate 101 functions as an electric conducting path. A use of the P-type substrate 101 doped at higher concentration achieves a reduction in the resistance. Further, an epitaxial layer (P-type epitaxial layer 103) doped at lower concentration is disposed on the P-type substrate 101. This allows reducing a junction capacitance between the P-type substrate 101 and the N-type epitaxial layer 105. Here, an object for forming the N-type epitaxial layer 105 is that the epitaxial layer is required for coexisting the substrate contact 107 with an NPN transistor 506 as shown in FIG. 2, and such N-type epitaxial layer 105 is used as a collector region of the NPN transistor 506, and further, an N+ type diffusion layer collector 502 providing a coupling a base 503 and an emitter 504 and a contact for a collector of the NPN transistor 506 with an N+ type buried region 501 is formed in the N-type epitaxial layer 105. Further, the P-type epitaxial layer 103 is formed to reduce the capacitance between the buried region 501 employed as a collector of the NPN transistor 506 and the P-type substrate 101.

Further, a trench 110 coupled to the P-type substrate 101 is provided in the P-type epitaxial layer 103 and the N-type epitaxial layer 105. Further, a periphery of the trench 110 is provided with a high concentration impurity region 112, which is formed in at least the P-type epitaxial layer 103 and in the N-type epitaxial layer 105 along an inner wall of the trench 110 and has a conductivity type identical to that of the P-type substrate 101. Further, the high concentration impurity region 112 of the first type conductivity is provided along the inner wall of the trench 110 so as to be coupled with the P-type substrate 101. For example, the high concentration impurity region 112 of the first type conductivity diffused in all the region from the upper surface of the N-type epitaxial layer 105 to the P-type substrate 101 is provided along the inner wall of the trench 110. Such high concentration impurity region 112 of the first type conductivity serves as an electric conducting path from the upper surface of the wafer to the P-type substrate 101. The semiconductor device of the present embodiment further includes the contacts 111 formed on the high concentration impurity region 112 of the first type conductivity.

The configuration as mentioned above allows forming the electric conducting paths from the upper surfaces of the contacts through the high concentration impurity region 112 of the first type conductivity to the P-type substrate 101. Such high concentration impurity region 112 of the first type conductivity is formed on the inner wall of the trench in the side of the epitaxial layer, and the electric conducting paths of lower resistances is realized, as compared with the polysilicon doped at higher concentration.

Figure 3:
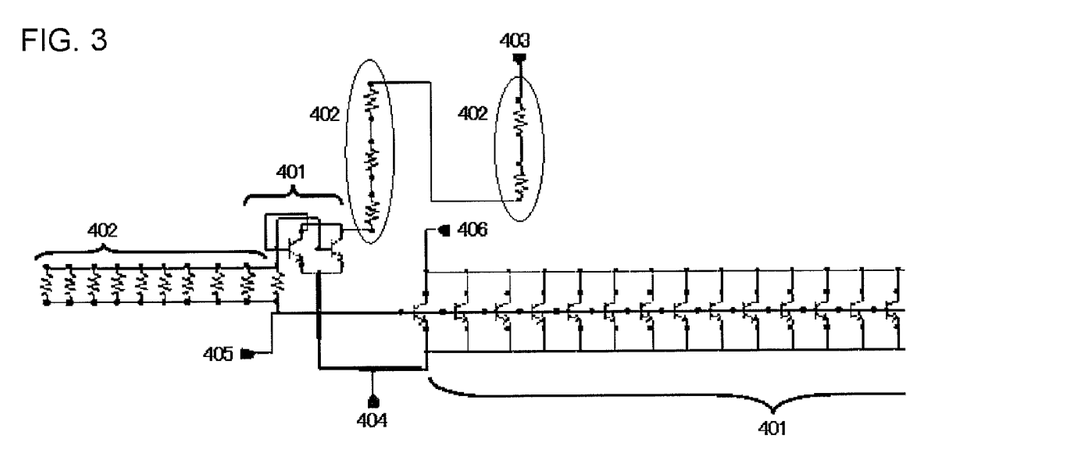
FIG. 3 is a circuit schematic of a power amplifier element.

FIG. 3 is a circuit schematic of a power amplifier employing transistors 401 of substrate-contact configurations of the present embodiment. When a voltage (voltage required for operating circuit or voltage for driving circuit) is applied to a charging-voltage terminal 403, dual-Tr-parallelly connected transistors 401 of the substrate-contact configuration coupled like diode are turned on, and thus, an electric current flows from the charging-voltage terminal 403 through a plurality of series resistor 402 thereof and the dual-Tr-parallelly connected transistors 401 of the substrate-contact configuration coupled like diode to a GND terminal 404. When the electric current flows through the series resistors 402, a voltage is dropped from a voltage applied to the charging-voltage terminal 403, which serves as, in turn, a voltage of the input terminal 405 (since ten parallel resistor 402 provides lower resistance, the voltage drop is smaller). Since the voltage in the input terminal 405 is designed to be higher than the VBE in the 20-Tr-parallelly connected transistors 401 of the substrate-contact configuration, the 20-Tr-parallelly connected transistors 401 of the substrate-contact configuration is turned on state, so that an electric current flows from an output terminal 406 (applied with a voltage for supplying electric current) to the GND terminal 404 through the 20-Tr-parallelly connected transistors 401 of the substrate-contact configuration. In other words, such power amplifier circuit element is operated in such way that, when a radio frequency (RF) signal of smaller amplitude is input from the input terminal 405, an RF signal with larger amplitude multiplied by the gain is output from the output terminal 406 by the 20-Tr-parallelly circuit-connected transistors 401 of the substrate-contact configuration. An advantageous effect obtained by employing the transistors 401 of the substrate-contact configuration is that a gain drop of a bonding wire ordinarily employed for the emitter terminal due to the inductance is avoided, thereby obtaining high gain characteristics.

The semiconductor device having the configuration of the present embodiment may be manufactured by, for example, a method as will be described below. The method for manufacturing the semiconductor device according to the present embodiment will be described as follows, in reference to FIGS. 4A to 4D. The configuration of the manufactured semiconductor device is similar to the configuration of the semiconductor device of the above-described embodiment shown in FIG. 1.

Figure 4A:
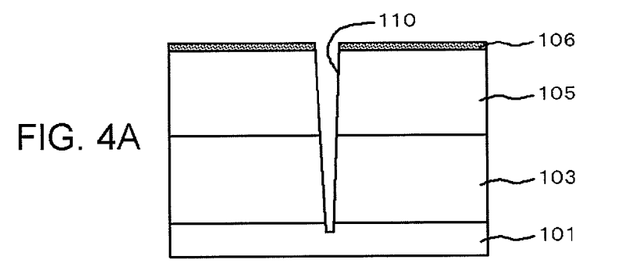
FIGS. 4A to 4D are cross-sectional views, illustrating a process for manufacturing the semiconductor device according to first embodiment.

First of all, the P-type epitaxial layer 103 with lower impurity concentration is formed on the P-type substrate 101, and further, the N-type epitaxial layer 105 with lower impurity concentration is formed on the P-type epitaxial layer 103. In the present embodiment, for example, an epitaxial layer composed of single crystalline silicon is formed, and then is doped at lower concentration. The resistance of the P-type substrate 101 is decreased by doping thereto with an impurity at higher concentration. For example, a specific-resistance is reduced to a level equal to or lower than 0.01 Ωcm. The P-type epitaxial layer 103 is doped at lower concentration, and the specific-resistance is for example, equal to or higher than 10 Ωcm. Further, the N-type epitaxial layer 105 having a specific-resistance of, for example about 1 Ωcm is formed on the P-type epitaxial layer 103. Such a configuration allows reducing a junction capacitance between the P-type substrate 101 and the N-type epitaxial layer 105.

Subsequently, the oxide film 106 is formed on the N-type epitaxial layer 105, and then is patterned. The trench 110 extending through the N-type epitaxial layer 105 and the P-type epitaxial layer 103 and coupled to the P-type substrate 101 is formed via an anisotropic etching through a mask of the oxide film 106 (FIG. 4A). The trench 110 having such feature is formed to create the high concentration impurity region 112 of the first type conductivity coupled to the P-type substrate 101 as discussed later. Subsequently, the wafer in the condition where the P-type epitaxial layer 103 and the N-type epitaxial layer 105 are exposed on the surface of the trench 110 is disposed within an interior of a diffusion furnace. Subsequently, a high concentration impurity diffusion is carried out in an atmosphere containing impurity of boron. The impurity is diffused from the exposed surface of the trench 110 to at least the interior of the P-type epitaxial layer 103 and the interior of the N-type epitaxial layer 105. This allows forming the high concentration impurity region 112 of the first type conductivity, which is at least formed along the inner wall of the trench 110 in the side of the low concentration epitaxial layer and is coupled with the P-type substrate 101.

Figure 4B:
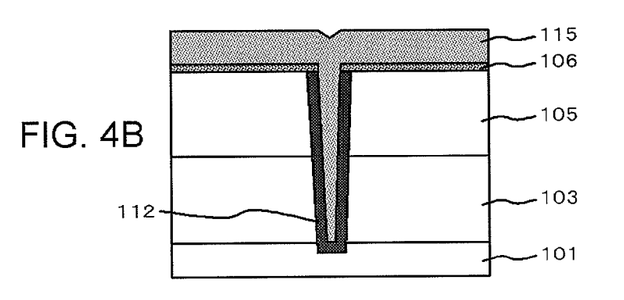

After the high concentration impurity region 112 of the first type conductivity is formed, the trench 110 is filled with the polysilicon 115 (FIG. 4B). In such case, polysilicon having arbitrary concentration may be employed for the polysilicon 115 for filling the trench 110. For example, polysilicon available here is not limited to a polysilicon doped at higher concentration, and a polysilicon doped at lower concentration or an undoped polysilicon may alternatively be employed to fill the trench 110. Since the high concentration impurity region 112 of the first type conductivity may be employed as a low resistance electric conducting path as described above, larger flexibility for selecting the material for filling the trench 110 can be provided in the present embodiment.

Figure 4C:
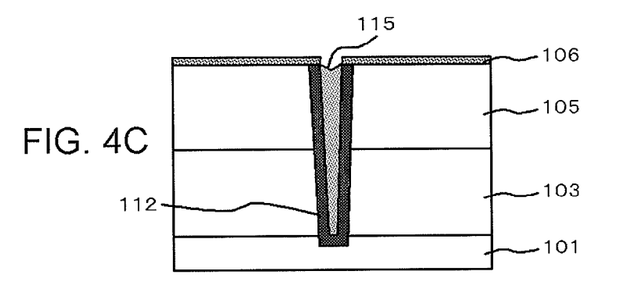
Figure 4D:
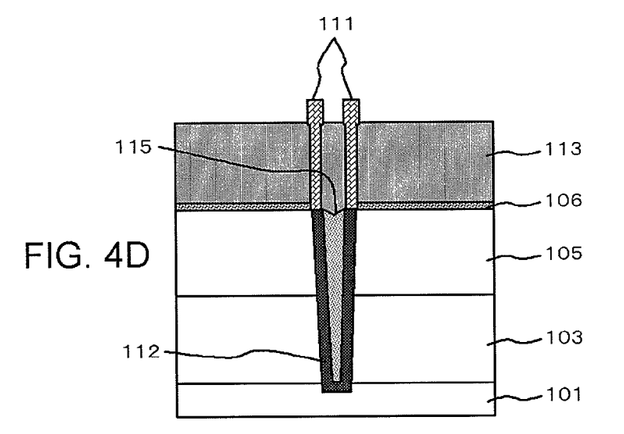

After the trench 110 is filled therewith, a dry etching process is carried out for the polysilicon 115 to remove unnecessary portions of the polysilicon 115. The oxide film 106 in this time serves as an etch stop film for the dry etching of the polysilicon (FIG. 4C). Subsequently, the insulating film 113 is formed on the oxide film 106 (FIG. 4D). Further, the contacts 111 extending through the insulating film 113 and the oxide film 106 are formed on the high concentration impurity region 112 of the first type conductivity. The contacts 111 are selectively formed so as to overlap at least a portion thereof on the high concentration impurity region 112 of the first type conductivity exposed on the upper surface of the N-type epitaxial layer 105 (FIG. 4D). Such contacts 111 may be formed as, for example, described below.

The formation for the contacts 111 may be conducted, so that the larger contacts are formed so as to include the entire high concentration impurity region 112 of the first type conductivity formed in the periphery of the trench, or so that thinner contacts are arranged to be ring-shaped or to be fragmentary such that at least a portion thereof is coupled with the high concentration impurity region 112 of the first type conductivity. Therefore, it is not necessary to be coupled with the material for filling the trench.

In this way, the semiconductor device having an operating route of an electric current path from the contacts 111 formed in the upper surface of the wafer through the high concentration impurity region 112 of the first type conductivity to the P-type substrate 101 is formed.

After the high concentration impurity region 112 of the first type conductivity is formed, and when the subsequent thermal processing is conducted at lower temperature and for shorter time as compared with the case of the impurity diffusion, a concern for re-diffusion of the impurity in the high concentration impurity region 112 of the first type conductivity to the material for filling the trench 110 such as polysilicon and the like is small. Therefore, a concern for reduced concentration of the high concentration impurity region 112 of the first type conductivity is also small. The dry etching process after filling the trench 110 may also be conducted in an ordinary manner.

While the preferred embodiments of the present invention have been described above in reference to the annexed figures, it should be understood that the disclosures above are presented for the purpose of illustrating the present invention, and various modifications other than that described above are also available. For example, while the P-type epitaxial layer 103 and the N-type epitaxial layer 105 are consecutively formed on the P-type substrate 101 in the above-described embodiment, only the P-type epitaxial layer may be formed. In such case, the N-type collector region of the bipolar transistor may be formed via, for example an ion implantation process. Further, while the example for employing the P-type substrate as the substrate is described above, the configuration is not limited thereto, and an N-type substrate may alternatively be employed. When the N-type substrate is employed, a P-type epitaxial layer is formed on the N-type substrate, or a P-type epitaxial layer and an N-type epitaxial layer are consecutively formed.

Further, while the polysilicon 115 is employed for the material for filling the trench 110 in the above-described embodiment, the configuration is not limited thereto. The low resistance electrically conducting path is formed in the epitaxial layer in the present invention, providing a number of options for selecting a material for the material for filling the inside of the trench 110. For example, a material, which is different from the material of the high concentration impurity region 112 of the first type conductivity, may alternatively be employed for the stuffing material, and for example, an insulating material such as an oxide film may be buried.

Further, in order to further reduce the low resistance and the low inductance value that are achieved by the present invention, it is needless to point out that multiple trenches and multiple contacts formed by the manner described above are arranged, which are coupled via a metal (metal line) 505.

Second Embodiment

The method for manufacturing the semiconductor device according to the present embodiment will be described as follows, in reference to FIGS. 5A to 5D. The configuration of the manufactured semiconductor device is similar to the configuration of the semiconductor device of the above-described embodiment shown in FIG. 1. The operations until the formation of the trench 110 are similar to that described in the above-described embodiment.

Figure 5A:
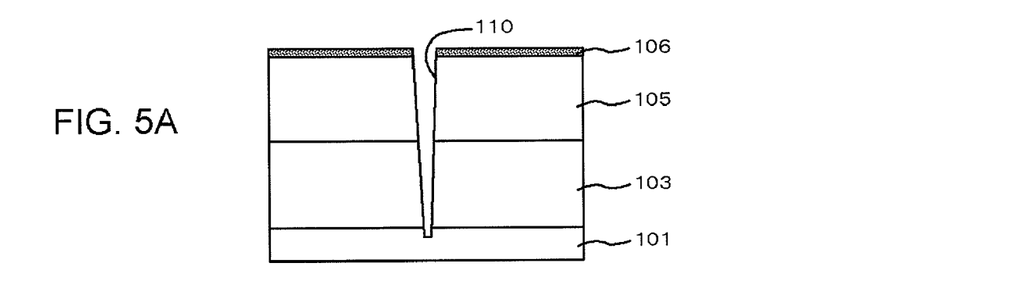
FIGS. 5A to 5D are cross-sectional views, illustrating a process for manufacturing the semiconductor device according to second embodiment.

Next, a polysilicon layer 108a is thinly grown on the entire surface of the trench 110 and on the entire surface of the oxide film 106. Subsequently, a boron diffusion at higher concentration is conducted to form the high concentration impurity region 112 of the first type conductivity on the low concentration epitaxial region in the side surface of the trench and on the bottom surface thereof. Further, the high concentration impurity region 112 of the first type conductivity is formed to be coupled to the P-type substrate 101 along the feature of the trench 110. Here, the concentration in the polysilicon layer 108a is arbitrary, and even an undoped polysilicon may be preferable, in view of forming the high concentration impurity region 112 of the first type conductivity with an improved efficiency. Alternatively, no growth of the polysilicon layer 108a may also be acceptable.

Figure 5B:
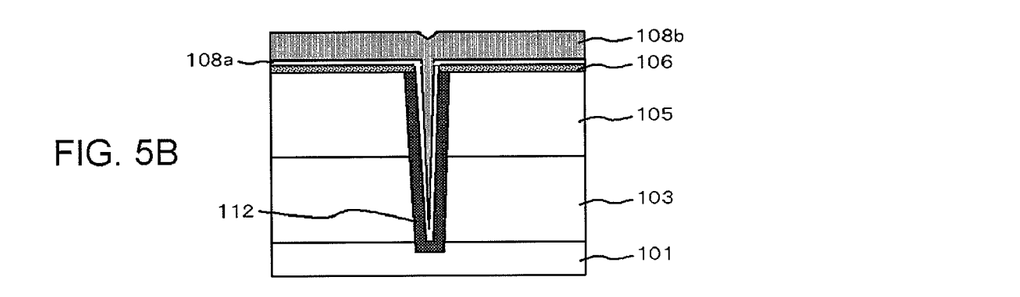

After the high concentration impurity region 112 of the first type conductivity is formed, a polysilicon layer 108b is buried so as to cover the upper surface of the wafer and fill the trench 110 (FIG. 5B). The concentration of the polysilicon layer 108b in this case is not particularly limited to any specific concentration and may be arbitrary, and even an undoped polysilicon may also be preferable.

Figure 5C:
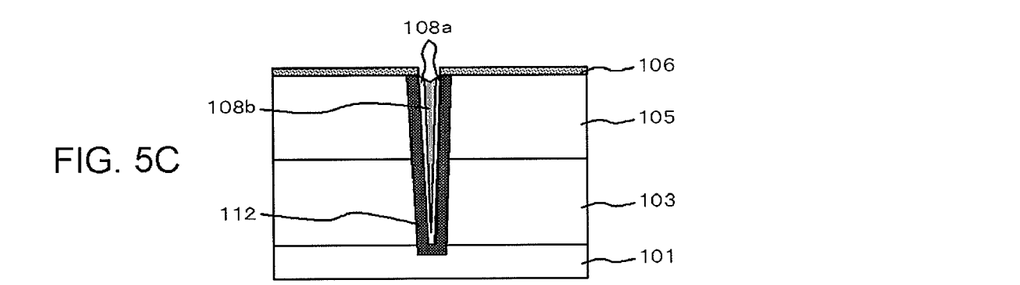

After a trench 110 is filled, a dry etching process is conducted for the polysilicon layers 108a and 108b to remove excessive portions of the polysilicon layers 108a and 108b.

Figure 5D:
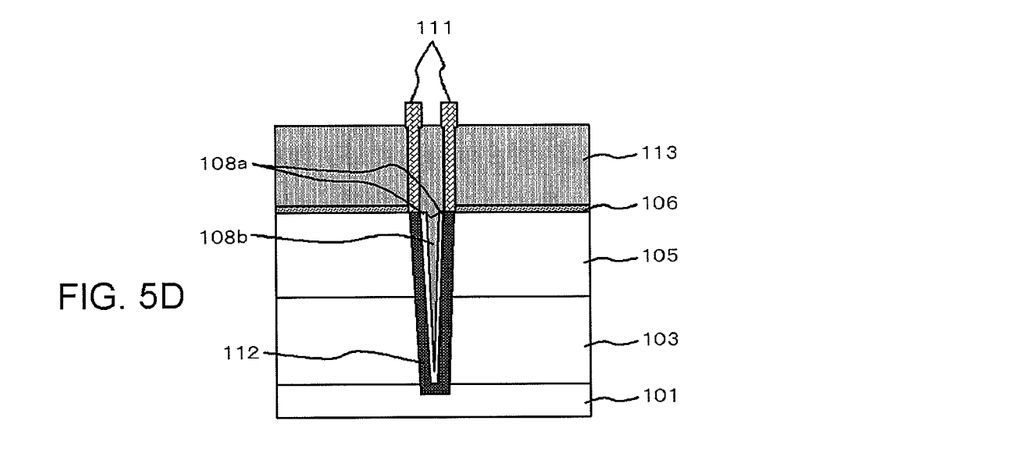

The oxide film 106 in this time serves as an etch stop film for the dry etching of the polysilicon (FIG. 5C). Subsequently, the insulating film 113 is formed on the oxide film 106. Then, the contact 111 extending through the insulating film 113 and the oxide film 106 and coupled to the high concentration impurity region 112 of the first type conductivity is formed. The contacts 111 are selectively formed so as to overlap at least a portion thereof on the high concentration impurity region 112 of the first type conductivity exposed on the upper surface of the N-type epitaxial layer 105 (FIG. 5D). In this way, similarly as in the above-described embodiment, the semiconductor device having an operating route of an electric current path from the contacts 111 formed in the upper surface of the wafer through the high concentration impurity region 112 of the first type conductivity to the P-type substrate 101 is formed.

In the present embodiment, the high concentration impurity region 112 of the first type conductivity of lower resistance is formed in the epitaxial layer as the electrically conducting path to the P-type substrate 101, instead of the conventional polysilicon. Since single crystalline silicon is employed for the high concentration impurity region 112 of the first type conductivity, the resistance is reduced by several times to more than ten times, as compared with polysilicon. More specifically, polysilicon having a thickness of about 0.3 µm exhibits a sheet resistance of about 100 Ω/sq. On the other hand, the sheet resistance of the high concentration impurity region 112 of the first type conductivity of single crystalline silicon formed along the inner wall of the trench 110 can be considerably reduced, and for example, a boron diffusion is conducted at 1,000 degrees C. to 1,030 degrees C. for around 20 minutes to achieve a sheet resistance of equal to or lower than 20 Ω/sq for the thickness of equal to or smaller than 0.3 µm. The contact 111 is formed on the high concentration impurity region 112 of the first type conductivity, so that an electrically conducting path with lower resistance extending from the surface of the wafer and electrically coupled to the P-type substrate 101 is ensured. Therefore, the reduced resistance of the electric current path is achieved.

Further, since the low resistance electrically conducting path is formed around the trench 110 in the present embodiment, the inside of the trench 110 is not required to be employed as an electrically conducting path. Therefore, larger flexibility for selecting the material for filling the inside of the trench 110 can be provided in the present embodiment. For example, the concentration of polysilicon is not particularly limited to any specific concentration when the trench 110 is filled with polysilicon, and a polysilicon doped at lower concentration or an undoped polysilicon may alternatively be employed. Therefore, a need for employing an apparatus for growing polysilicon doped at higher concentration is avoided. Further, even if a polysilicon doped at higher concentration is employed, the resistance of the high concentration impurity region 112 of the first type conductivity formed to cover the inner wall of the trench 110 is considerably lower, as compared with polysilicon. Therefore, the high concentration impurity region 112 of the first type conductivity functions as an electrically conducting path, and polysilicon in the inside of the trench 110 does not contribute for an electrically conducting path. Even if the trench 110 is filled with an undoped polysilicon in the present embodiment, the low resistance electrically conducting path to the P-type substrate 101 can be created.

The contact 111 is formed on the high concentration impurity region 112 of the first type conductivity in the present embodiment, so that a low resistance electrically conducting path from the electrode and the like coupled to the contact 111 to the P-type substrate 101 is achieved. For example, the back surface of the P-type substrate 101, or in other words, the surface opposite the surface having the contact 111 and the trench 110 and the like formed thereon, is utilized as GND (earth), and the contact 111 may be employed as a GND contact.

The semiconductor device of the present embodiment may be preferably employed for products for high frequency. For example, the semiconductor device of the present embodiment may be employed as a part of a power amplifier element. When substrate contact of the present embodiment is employed as a grounded emitter of a power amplifier element, various benefits such as improvement in the gain due to the effect for reducing the emitter inductance, reduced chip area due to the reduction of ground bonding wires and pads, reduced assembling cost, and miniaturization of the package and the like are obtained. Therefore, the power amplifier element of smaller size with low price can be achieved by employing the semiconductor device of the present embodiment.

It is apparent that the present invention is not limited to the above embodiment, and may be modified and changed without departing from the scope and spirit of the invention.

What is claimed is:

1. A semiconductor device, comprising:
a semiconductor substrate with a high concentration impurity of a first type conductivity;
an epitaxial layer with a low concentration impurity provided on said semiconductor substrate with said high concentration impurity of a first type conductivity;
a trench coupled to said semiconductor substrate with said high concentration impurity of a first type conductivity being provided in said epitaxial layer with said low concentration impurity;
a high concentration impurity region of the first type conductivity, formed in at least said epitaxial layer with said low concentration impurity along an inner wall of said trench so as to directly contact said epitaxial layer with said low concentration impurity and coupled to said semiconductor substrate with said high concentration impurity of a first type conductivity;
an insulating film formed on said epitaxial layer with said low concentration impurity; and
a contact formed on said high concentration impurity region of the first type conductivity and in said insulating film.

2. The semiconductor device as set forth in claim 1, wherein said contact is selectively formed on said high concentration impurity region of the first type conductivity.

3. The semiconductor device as set forth in claim 1, wherein said trench is filled with a different material, which is different from a material of said high concentration impurity region of the first type conductivity.

4. The semiconductor device as set forth in claim 3, wherein said trench is filled with polysilicon of said different material.

5. The semiconductor device as set forth in claim 3, wherein the epitaxial layer with the low concentration impurity provided on said semiconductor substrate with said high concentration impurity of a first type conductivity includes:
a first epitaxial layer with a low concentration impurity of the first type conductivity disposed on said semiconductor substrate with said high concentration impurity of a first type conductivity; and
a second epitaxial layer with a low concentration impurity of a second type conductivity disposed on the first epitaxial layer with the low concentration impurity of the first type conductivity.

6. A power amplifier element having an emitter terminal connected to a current path, the current path comprising a semiconductor device as set forth in claim 1.

7. The semiconductor device as set forth in claim 1, wherein the high concentration impurity region of the first type conductivity directly contacts the inner wall of said trench.

8. The semiconductor device as set forth in claim 1, wherein the contact is formed directly on said high concentration impurity region of the first type conductivity.

9. A semiconductor device, comprising:
a semiconductor substrate with a high concentration impurity of a first type conductivity;
an epitaxial layer with a low concentration impurity provided on said semiconductor substrate with said high concentration impurity of a first type conductivity;
a trench coupled to said semiconductor substrate with said high concentration impurity of a first type conductivity being provided in said epitaxial layer with said low concentration impurity;
a high concentration impurity region of the first type conductivity, formed in at least said epitaxial layer with said low concentration impurity along an inner wall of said trench and coupled to said semiconductor substrate with said high concentration impurity of a first type conductivity; and
a contact formed on said high concentration impurity region of the first type conductivity,
wherein said trench is filled with a different material, which is different from a material of said high concentration impurity region of the first type conductivity, and
wherein an insulating film is formed on said epitaxial layer with said low concentration impurity, on said high concentration impurity region of the first type conductivity, and on the different material, which is different from the material of said high concentration impurity region of the first type conductivity filling in the interior of said trench, or on the polysilicon filling said trench, and
wherein a contact extending through said insulating film on said high concentration impurity region of the first type conductivity is provided.

10. A semiconductor device comprising:
a semiconductor substrate with a high concentration impurity of a first type conductivity;
an epitaxial layer with a low concentration impurity provided on said semiconductor substrate with said high concentration impurity of a first type conductivity;
a trench coupled to said semiconductor substrate with said high concentration impurity of a first type conductivity being provided in said epitaxial layer with said low concentration impurity;
a high concentration impurity region of the first type conductivity, formed in at least said epitaxial layer with said low concentration impurity along an inner wall of said trench and coupled to said semiconductor substrate with said high concentration impurity of a first type conductivity; and
a contact formed on said high concentration impurity region of the first type conductivity,
wherein said trench is filled with a different material, which is different from a material of said high concentration impurity region of the first type conductivity,
wherein the epitaxial layer with the low concentration impurity provided on said semiconductor substrate with said high concentration impurity of a first type conductivity includes:
a first epitaxial layer with a low concentration impurity of the first type conductivity disposed on said semiconductor substrate with said high concentration impurity of a first type conductivity; and
a second epitaxial layer with a low concentration impurity of a second type conductivity disposed on the first epitaxial layer with the low concentration impurity of the first type conductivity, and wherein the semiconductor device further comprises:

a collector region of a transistor provided in the second said epitaxial layer with said low concentration impurity of the second type conductivity;

a base region of the transistor of the first type conductivity provided in said collector region of the transistor of the second type conductivity;

an emitter region of the transistor of the second type conductivity provided in said base region of the transistor of the first type conductivity;

said second epitaxial layer with said low concentration impurity of the second type conductivity;

an insulating film formed on said collector region, on said base region and said emitter region, on said high concentration impurity region of the first type conductivity and a different material, which is different from a material of said high concentration impurity region of the first type conductivity filling said trench, or on the polysilicon filling said trench;

a contact extending through said insulating film and coupled with said collector region;

a contact extending through said insulating film and coupled with said base region;

a contact extending through said insulating film and coupled with said emitter region; and a contact extending through said insulating film and coupled with said high concentration region of the first type conductivity, wherein a contact coupled with said high concentration impurity region of the first type conductivity is coupled with the contact coupled with said emitter region via a metal.

* * * * *